(12) United States Patent
Latchford et al.

(10) Patent No.: US 6,780,753 B2
(45) Date of Patent: Aug. 24, 2004

(54) AIRGAP FOR SEMICONDUCTOR DEVICES

(75) Inventors: Ian S. Latchford, Palo Alto, CA (US); Christopher D. Bencher, San Jose, CA (US); Michael D. Armacost, Sunnyvale, CA (US); Timothy Weidman, Sunnyvale, CA (US); Christopher Ngai, Burligame, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/159,711

(22) Filed: May 31, 2002

(65) Prior Publication Data

US 2003/0224591 A1 Dec. 4, 2003

(51) Int. Cl.[7] ..................... H01L 21/4763; H01L 21/44; H01L 21/302
(52) U.S. Cl. .................. 438/619; 438/597; 438/619; 438/672; 438/697; 438/710; 438/725; 438/737
(58) Field of Search ................. 438/597, 619, 438/672, 697, 710, 725, 737

(56) References Cited

U.S. PATENT DOCUMENTS

| | | | |
|---|---|---|---|
| 5,324,683 A | 6/1994 | Fitch et al. | 437/65 |
| 5,407,860 A | 4/1995 | Stoltz et al. | 437/180 |
| 5,461,003 A * | 10/1995 | Havemann et al. | 438/666 |
| 5,567,982 A | 10/1996 | Bartelink | 257/664 |
| 5,599,745 A | 2/1997 | Reinberg | 437/195 |
| 5,759,913 A | 6/1998 | Fulford, Jr. et al. | 438/624 |
| 5,866,920 A | 2/1999 | Matsumoto et al. | 257/63 |
| 5,880,018 A | 3/1999 | Boeck et al. | 438/619 |
| 5,900,668 A | 5/1999 | Wollesen | 257/522 |
| 5,949,143 A | 9/1999 | Bang | 257/758 |
| 5,950,102 A | 9/1999 | Lee | 438/619 |
| 5,994,776 A | 11/1999 | Fang et al. | 257/758 |
| 6,030,901 A | 2/2000 | Hopper et al. | 438/711 |
| 6,057,226 A * | 5/2000 | Wong | 438/623 |
| 6,064,118 A | 5/2000 | Sasaki | 257/758 |
| 6,077,767 A | 6/2000 | Hwang | 438/619 |
| 6,090,698 A | 7/2000 | Lee | 438/619 |
| 6,091,149 A | 7/2000 | Hause et al. | 257/758 |
| 6,130,151 A | 10/2000 | Lin et al. | 438/619 |
| 6,159,845 A | 12/2000 | Yew et al. | 438/637 |
| 6,165,890 A * | 12/2000 | Kohl et al. | 438/619 |
| 6,204,168 B1 | 3/2001 | Naik et al. | 438/638 |
| 6,208,015 B1 | 3/2001 | Bandyopadhyay et al. | 257/635 |
| 6,211,057 B1 | 4/2001 | Lin et al. | 438/619 |

(List continued on next page.)

OTHER PUBLICATIONS

S. Wolf and R. N. Tauber, Silicon Processing for the VLSI Era Process Technology Lattice Press, vol. 1 pp. 569–570.*

(List continued on next page.)

Primary Examiner—John F. Niebling
Assistant Examiner—Stanetta Isaac
(74) Attorney, Agent, or Firm—Moser, Patterson & Sheridan (57) ABSTRACT

Embodiments of the invention generally provide a method of forming an air gap between conductive elements of a semiconductor device, wherein the air gap has a dielectric constant of approximately 1. The air gap may generally be formed by depositing a dielectric material between the respective conductive elements, depositing a porous layer over the conductive elements and the dielectric material, and then stripping the dielectric material out of the space between the respective conductive elements through the porous layer, which leaves an air gap between the respective conductive elements. The dielectric material may be, for example, an amorphous carbon layer, the porous layer may be, for example, a porous oxide layer, and the stripping process may utilize a downstream hydrogen-based strip process, for example.

18 Claims, 4 Drawing Sheets

U.S. PATENT DOCUMENTS

| | | | |
|---|---|---|---|
| 6,246,118 B1 | 6/2001 | Buynoski | 257/758 |
| 6,252,290 B1 | 6/2001 | Quek et al. | 257/522 |
| 6,265,321 B1 * | 7/2001 | Chooi et al. | 438/725 |
| 6,268,276 B1 | 7/2001 | Chan et al. | 438/619 |
| 6,291,030 B1 | 9/2001 | Chao et al. | 427/579 |
| 6,297,554 B1 | 10/2001 | Lin | 257/752 |
| 6,303,464 B1 | 10/2001 | Gaw et al. | 438/422 |
| 6,316,347 B1 | 11/2001 | Chang et al. | 438/619 |
| 6,333,255 B1 | 12/2001 | Sekiguchi | 438/622 |
| 6,380,106 B1 * | 4/2002 | Lim et al. | 438/778 |
| 6,403,461 B1 | 6/2002 | Tae et al. | 438/619 |
| 6,413,852 B1 * | 7/2002 | Grill et al. | 438/619 |
| 6,509,623 B2 * | 1/2003 | Zhao | 257/522 |
| 6,541,397 B1 | 4/2003 | Bencher | |
| 2001/0007788 A1 | 7/2001 | Chang et al. | 438/421 |
| 2001/0040267 A1 | 11/2001 | Lien et al. | 257/522 |
| 2002/0020053 A1 | 2/2002 | Fonash et al. | 29/623.1 |
| 2002/0090794 A1 | 7/2002 | Chang et al. | 438/421 |
| 2002/0149085 A1 | 10/2002 | Lin et al. | 257/522 |
| 2003/0186477 A1 | 10/2003 | Bencher | |

OTHER PUBLICATIONS

Togo, et al.; *A Gate-side Air-gap Structure GAS to Reduce the Parasitic Capacitance in MOSFETs*; 1996 Symposium on VLSI Technology Digest of Technical Papers; pp38–39.

Ueda, et al.; *A Novel Air Gap Integration Scheme for Multi-level Interconnects using Self-aligned Via Plugs*; 1998 Symposium on VLSI Technology Digest of Technical Papers; pp 46–47.

Ueda, et al.; *Integration of Level Air Gap Interconnect for Sub-quarter Micron CMOS*; 1999 Symposium on VLSI Technology Digest of Technical Papers; pp 111–112.

Nitta, et al.; *Opportunites and Challenges in Cu/Ultra Low-k Interconnects*; 2002 AVS $3^{rd}$ International Conference on Microelectronics and Interfaces, Feb. 11–14; pp 101–104.

* cited by examiner

AIRGAP FOR SEMICONDUCTOR DEVICES

BACKGROUND OF THE INVENTION

1. Field of the Invention

Embodiments of the invention generally relate to a method for forming an air gap between conductive elements of a semiconductor device, wherein the air gap has a dielectric constant (k) of approximately 1.

2. Description of the Related Art

Reliably producing sub-quarter micron and smaller features on semiconductor substrates is a key technology for the next generation of very large scale integration (VLSI) and large-scale integration (ULSI) devices. However, as the fringes of circuit technology are advanced, the shrinking dimensions of the interconnect features places increasing demands on the processing techniques and the physical characteristics of the materials used to manufacture the devices. For example, in order to improve the density of semiconductor devices on integrated circuits, the size of features thereon has decreased to the sub-quarter micron range. Additionally, copper has essentially replaced aluminum as the primary conductor, primarily as a result of the lower resistivity provided by copper. Further, the shrinking dimensions have necessitated dielectric materials, i.e., the material positioned between the conductive features, having lower dielectric constants than previously utilized, i.e., low k, as defined herein, generally refers to dielectric constants of less than about 4.0, as the increased capacitive coupling between layers resulting from the closeness of the conductive elements can detrimentally affect the functioning of semiconductor devices.

A common method utilized to form the currently desired multilayer semiconductor devices is a damascene or dual damascene process. In a damascene method, for example, one or more low k dielectric materials are deposited and pattern etched to form the vertical and horizontal interconnects. Conductive materials, such as copper-containing materials and other conductive materials, such as barrier layer materials used to prevent diffusion of copper-containing materials into the surrounding low k dielectric material, are then inlaid into the etched pattern or features. These conductive materials are generally deposited in excess in order to insure that the features formed in the dielectric layer are adequately filled. However, the excess copper-containing materials and excess barrier layer material external to the etched pattern, such as on the field of the substrate, are generally removed via, for example, a chemical mechanical polishing process. Once the excess deposition is removed, the device generally has a substantially planar upper surface that includes the conductive and insulative elements exposed therefrom, and therefore, an insulating layer is generally deposited thereover to insulate the first layer of features from a second layer that may be deposited on top of the first layer.

However, one challenge associated with damascene processes is that the size of the individual features therein continues to decrease in order to accommodate the increasing circuit density. As a result thereof, the dielectric constant of the material separating the respective conductive elements must also decrease in order to maintain electrical isolation of the respective conductive elements. Although current low k dielectric materials may provide a k value of between about 2.0 and about 3.5, for example, materials having lower dielectric constants will be required in order to support the continuing decrease in feature sizes and increases in circuit density.

Therefore, there exists a need for a spacer to be used between conductive elements of a semiconductor device, wherein the spacer provides a dielectric constant below about 2.

SUMMARY OF THE INVENTION

Embodiments of the invention generally provide a method of forming an air gap between conductive elements of a semiconductor device, wherein the air gap has a dielectric constant of approximately 1. The air gap may generally be formed by depositing a dielectric material between the respective conductive elements, depositing a porous layer over the conductive elements and the dielectric material, and then stripping the dielectric material out of the space between the respective conductive elements through the porous layer, which leaves an air gap between the respective conductive elements. The dielectric material may be, for example, an amorphous carbon layer, the porous layer may be, for example, a porous oxide layer, and the stripping process may utilize a downstream hydrogen-based strip process, for example.

Embodiments of the invention may further provide a method for forming a low k spacer between conductive interconnects. The method generally includes forming interconnect features into a dielectric layer deposited on a substrate, wherein the dielectric layer is an amorphous carbon layer, and filling the interconnect features with a conductive material. The method further includes depositing a porous layer over the filled interconnect features and dielectric layer, the porous layer having an ordered pore structure and stripping the dielectric layer out of an area between the filled conductive interconnects through the porous layer to form an air gap between the conductive interconnects. Finally, the method may include depositing a capping layer over the porous layer to seal the ordered pore structure.

Embodiments of the invention may further provide a method for forming a spacer between conductive members of a semiconductor device. The method may generally include depositing a dielectric layer on a substrate, forming features into the dielectric layer, and filling the features with a conductive material. The method may further include depositing a porous layer over the filled interconnect features and dielectric layer, the porous layer having an ordered pore structure, stripping the dielectric layer out of an area between the filled conductive interconnects through the porous layer to form an air gap between the conductive interconnects, and depositing a capping layer over the porous layer to seal the ordered pore structure.

Embodiments of the invention may further provide a method for forming a spacer having a dielectric constant of about 1 between conductive features of a semiconductor device. The method may include depositing an amorphous carbon layer onto a substrate using a chemical vapor deposition process, etching features into the amorphous carbon layer, and filling the features etched into the amorphous carbon layer with a conductive material using at least one of an electrochemical plating process, an electroless plating process, a physical vapor deposition process, and a chemical vapor deposition process. Additionally, the method may include using a chemical mechanical polishing process to planarize an upper surface of the semiconductor device, depositing a porous oxide layer over the filled features and amorphous carbon layer, stripping the amorphous carbon layer from areas between conductive elements via a downstream hydrogen-based stripping process configured to remove the amorphous carbon layer through pores in the porous oxide layer, which operates to form an air gap between the conductive elements, and depositing a capping layer over the porous oxide layer to seal the pores.

Embodiments of the invention may further provide a method for forming a low k spacer between conductive interconnect features formed into a dielectric layer on semiconductor substrate. The method may include depositing a porous layer over the interconnect features and dielectric layer, removing at least a portion the dielectric layer out of an area between the conductive interconnect features through the porous layer to form an air gap between the conductive interconnect features, and depositing a capping layer over the porous layer to seal the porous layer. The resulting space between the interconnect features being filled with air, which generates a dielectric constant of about 1.

BRIEF DESCRIPTION OF THE DRAWINGS

So that the manner in which the above recited features of the invention are obtained may be understood in detail, a more particular description of the invention, briefly summarized above, may be had by reference to the embodiments thereof, which are illustrated in the appended drawings. It is to be noted, however, that the appended drawings illustrate only exemplary or typical embodiments of the invention, and therefore, are not to be considered limiting of its scope, for the invention may admit to other equally effective embodiments.

DETAILED DESCRIPTION OF THE PREFERRED EMBODIMENT

The present invention generally provides a method for forming an air gap between conductive elements of a semiconductor device. The air gap is generally formed by depositing a removable material between the conductive elements, depositing a porous layer over the removable material and the conductive elements, and then stripping the deposited material out of the space between the conductive elements through the porous layer to leave an air gap between the conductive elements.

Figure 1:
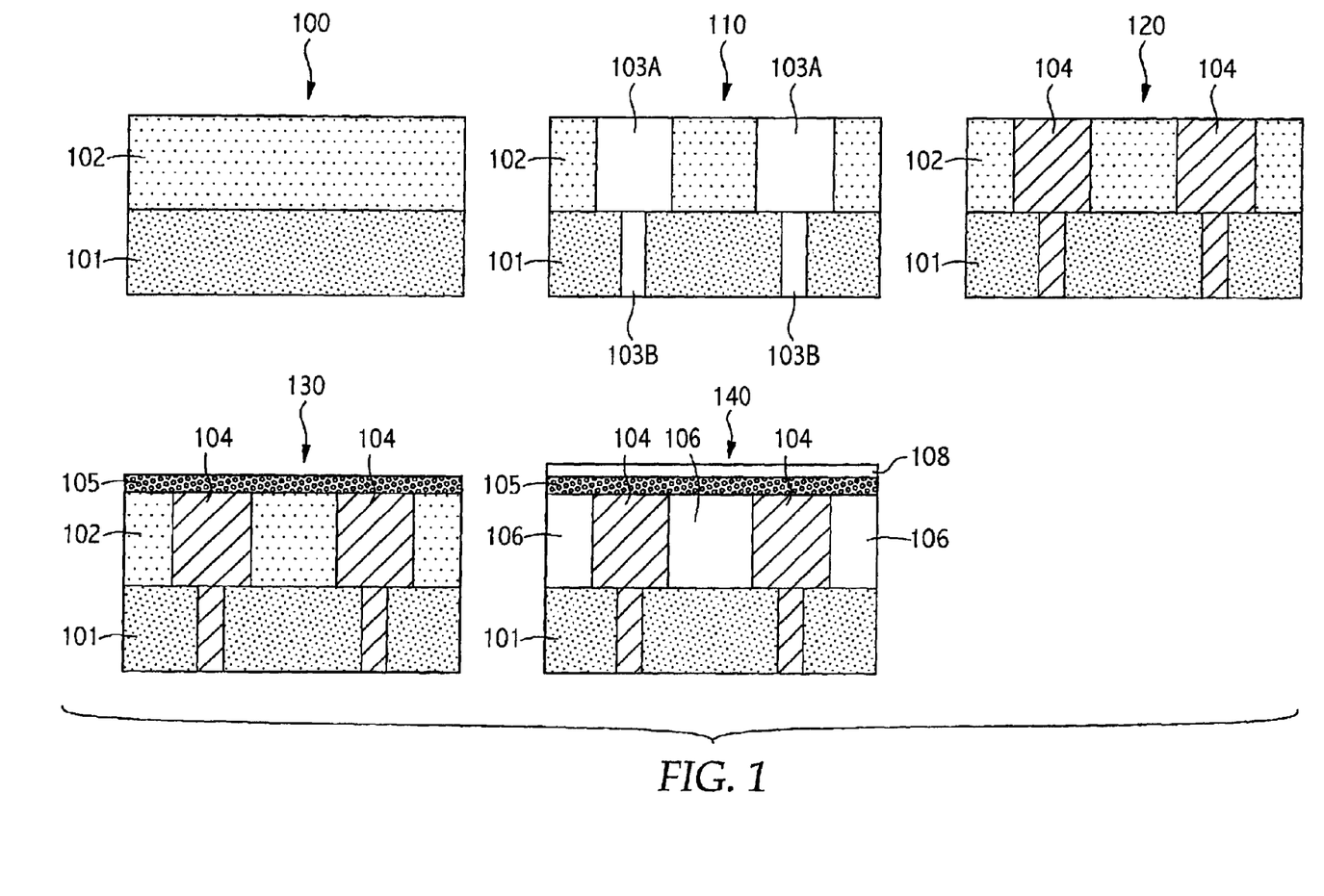
FIG. 1 illustrates an exemplary method for forming a low k air gap between conductive elements of a semiconductor device using a porous layer.

FIG. 1 illustrates an exemplary method for forming a gap or space between conductive elements of a semiconductor device, wherein the gap or space has a dielectric constant of less than about 2. The method begins at step 100, where a low dielectric constant material layer 101, such as a Black Diamond™ insulating layer, for example, is deposited on a semiconductor substrate (not shown). The low dielectric constant layer 101 may be deposited, for example, using a chemical vapor deposition process or a plasma enhanced chemical vapor deposition process. A second layer 102, which may be an amorphous carbon layer, for example, may be deposited on top of the low dielectric constant material layer 101, and may also be deposited via a chemical vapor deposition or a plasma enhanced chemical vapor deposition process, for example. As such, the low dielectric constant material layer 101 may generally form a first layer, i.e., a layer that may be used for vias, plugs, and multilevel interconnect features, while the second layer 102 may be used for larger single layer features, such as trenches, for example. Once the first and second layers are formed on the substrate, various features may be formed into the respective layers, as illustrated in step 110, through known etching, lithography, or other methods calculated to form features into semiconductor device layers. For example, a trench 103A may be etched into second layer 102, and a via 103B may be etched into first layer 101. Once the desired features are formed and/or etched into the respective layers, the features may be filled with a conductive material 104, which may be copper, for example, as illustrated in step 120. Although not illustrated, a barrier layer may be deposited into the respective features prior to the deposition of the conductive layer in order to prevent diffusion from the conductive layer into the adjoining layer. The conductive material 104 may be over deposited in order to adequately fill features 103A and 103B, and therefore, the upper surface of the conductive material 104 and the second layer 102 may be planarized to form a substantially planar surface, as illustrated in step 120.

Once the upper surface of the conductive material 104 and the second layer 102 is planarized, a porous layer 105 may be deposited thereon, as illustrated in step 130. The porous layer 105, which may generally be of sufficient thickness to provide structural rigidity and support to a subsequent layer deposited thereon, generally includes a relatively dense concentration of pores formed therein. The pores may be arranged in an organized interconnected manner, i.e., the pores in the respective layers may be generally in vertical alignment so that molecules may easily travel from one side of the porous layer to the other in a generally straight line via the organized interconnected pores. The organized interconnected pores generally represent aligned pores, i.e., similar to columns, so that molecules having a diameter less than the pore diameter may be communicated through the porous layer 105. Alternatively, the pores may be arranged in an unorganized manner, i.e., in a manner where the pores are not generally aligned vertically, and therefore, the pores do not generally form a straight line transmission path through the porous layer. In this arrangement, the pores will generally be offset from each other, and therefore, molecules traveling through the porous layer will travel a vertical distance through one pore and then travel horizontally to another pore before proceeding vertically thought the thickness of the layer. The porous layer 105 may be any number of porous layers, not limited to, for example, a porous oxide layer, a porous nitride layer, a porous BLOk layer, combinations of the aforementioned layers, or other porous layers known in the semiconductor art. The porous layer 105 may be, for example, between about 100 angstroms and about 1000 angstroms thick, and may have pores formed therein having a diameter of between about 10 angstroms and about 200 angstroms. More particularly, the porous layer 105 may be between about 200 angstroms and about 600 angstroms thick, and have pores formed therein having a diameter of between about 20 angstroms and about 60 angstroms.

Porous layer 105 may be a layer with highly controlled and reproducible ordered pore sizes and shapes are formed using molecular self-assembly in a sol-gel condensation process. In this process, for example, a liquid solution is formed by means of the hydrolysis of a silicon alkoxide, such as tetraethylorthosilicate, within a solution comprised of a suitable water-soluble solvent, such as propylene glycol monopropyl ether, to which water and a suitable acid are added. The acid-catalyzed hyrolysis of silicon alkoxide produces a complex mixture of partially polymerized silanols suspended within the solution. A surfactant added to the solution provides the template structures for molecular self-assembly. A critical range of surfactant concentration is generally required for proper segregation of the surfactant into micelles during subsequent drying. A low concentration of tetramethylammonium salt may also be added to the chemical precursor solution to provide the chemical environment required during the final calcination step. The surfactant molecules, which are generally amphiphilic, may include a combination of hydrophobic and hydrophilic sections. During the early drying phase, the amphiphilic molecules self-assemble into structures oriented such that the short hydrophilic portions of the molecules are positioned on the outer surfaces of the structures, in contact with the water-soluble environment, while the extended hydrophobic portions cluster together comprising the inner body of the micelles. The solvated silanols coat the outer water-soluble portions of the self-assembled micelles, forming the embryonic porous film framework. During evaporation of the solvent, the structures generally form supramolecular assemblies.

During the layer deposition processing for porous layer 105 the liquid chemical precursor containing all of the required ingredients may be applied to a spinning substrate surface such that the chemical precursor coats the entire substrate surface. Substrate rotation velocity is then rapidly accelerated to a predetermined final spin speed which determines film thickness (film thickness is also influenced by certain additional factors, including solution viscosity). The solvent (together with most of the excess water content) evaporates during spinning, producing a "tacky" film. The film is then further dried on a hot plate, for example, at 140° C. for one minute. The final film structure is formed at a calcination step using an elevated temperature, which may be for example, between about 350° C. and about 400° C. During calcination, the surfactant templates are removed from the film by ablation, thus producing the desired film with interconnected ordered pores. The interconnected pore pathways aid extraction of the surfactant. The ordered pores are well characterized by a narrow distribution of pore size by virtue of the solvent-evaporation-induced self-assembled micelle formation as well as the uniform size of the surfactant molecules employed, which determines micelle size. Micelle size can be tuned by judicious selection of surfactant molecular dimensions, and total porosity can be adjusted by means of surfactant concentration employed within the chemical precursor solution.

The porous layer 105 may also be deposited through known semiconductor layer deposition techniques, such as, for example, chemical vapor deposition and plasma enhanced chemical vapor deposition processes. Once the porous layer 105 is deposited, the portions of the second layer 102 positioned between the respective features, i.e., the amorphous carbon layer separating the respective conductive features in the second level, may be removed by a stripping process, as illustrated in step 140. The stripping process, which may be a hydrogen based stripping process if second layer 102 is an amorphous carbon layer, for example, generally operates to cause the molecules forming the dielectric layer between the respective conductive elements to flow out of the region between the conductive elements through the porous layer 105. As a result thereof, the region between the conductive elements is emptied of the dielectric material residing therein, and therefore, an air gap 106 is formed between the respective conductive elements. Inasmuch as air is generally known to have a dielectric constant of 1, the removal of the dielectric material from the region between the respective conductive elements leaving the air gap 106 therebetween operates to generate a dielectric constant of approximately 1 between the respective conductive members. An exemplary process for stripping the organic layer through the pores employs a downstream hydrogen-based plasma process. This process avoids exposing the film directly to energetic ions by generating the reactive chemical species remotely from the wafers to be stripped. The process may be carried out using an ASP chamber manufactured by Applied Materials of Santa Clara, Calif., for example. An example of applicable ASP chamber processing parameters may be an etch gas composition of about 3000 sccm hydrogen and about 30 sccm water vapor. The chamber pressure may be about 2 torr and the substrate temperature may be about 250° C. The microwave power may be about 1400W and the processing time period may be about 70 seconds. Once the stripping process is complete, a capping or sealing layer 108, which may also be a low k-type material, may be deposited over the porous layer 105 in order to seal the pores formed therein and prevent backflow of material into the air gap region.

Figure 2:
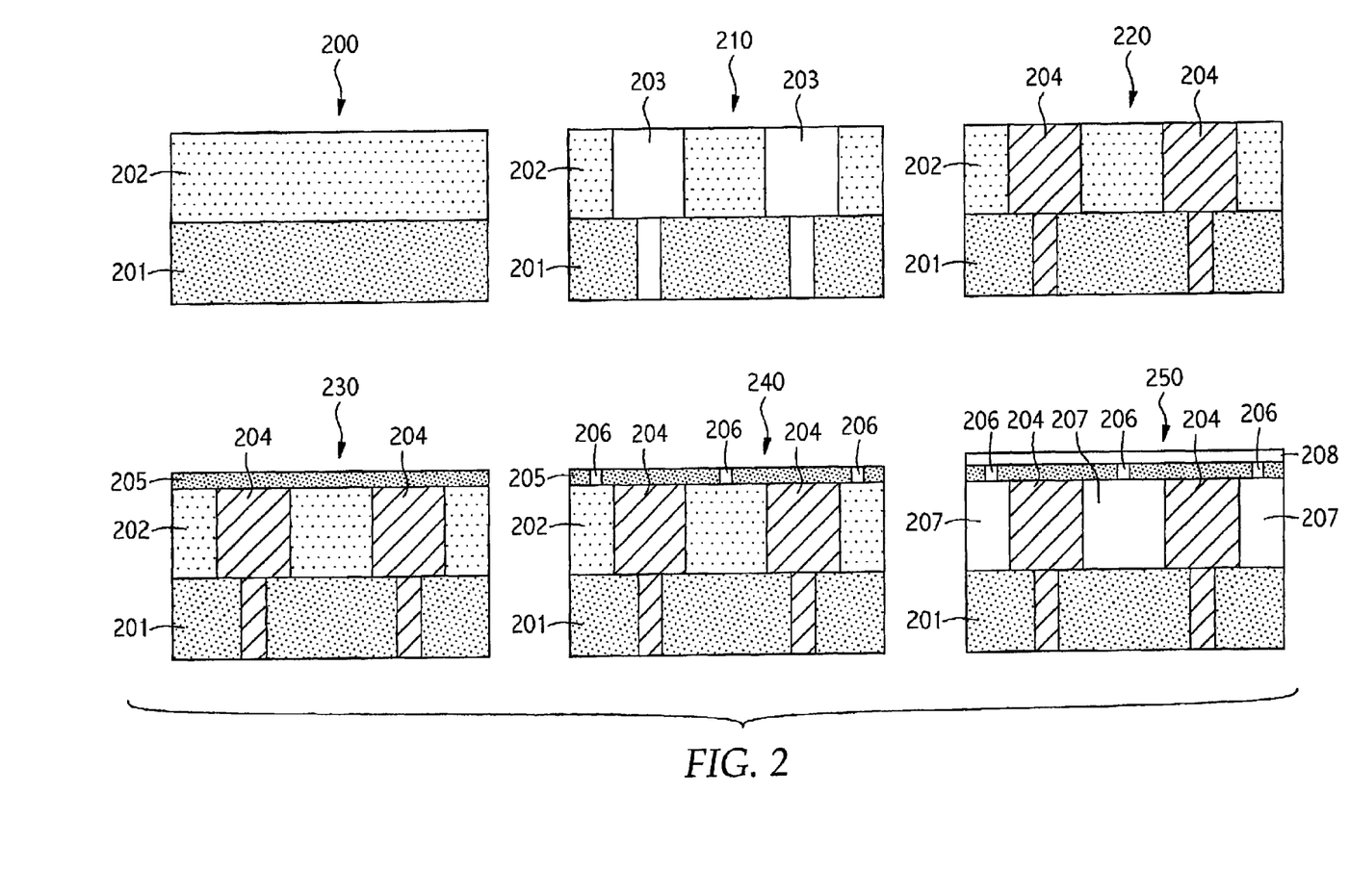
FIG. 2 illustrates an exemplary method for forming a low k air gap between conductive elements of a semiconductor device using a mask layer having apertures formed therein.

In another embodiment of the invention, an air spacer may be formed without using a stripping process, as the dielectric material is removed from a region between conductive elements through an aperture formed into an overlying layer. In this embodiment, which is illustrated in FIG. 2, a low or low dielectric constant material layer 201, such as a Black Diamond™ insulating layer, for example, is deposited on a semiconductor substrate, and an amorphous carbon layer 202 is deposited over the low dielectric constant material layer 201, as illustrated in step 200. In similar fashion to the embodiment illustrated in FIG. 1, layers 201 and 202 may be formed through a plurality of known deposition processes, such as, for example, chemical vapor deposition. Once the layers 201 and 202 are formed, various features 203, i.e., lines, plugs, vias, trenches, etc., may be formed into layers 201 and 202 as desired to support the devices being manufactured, as illustrated in step 210. The process of forming features 203 into layers 201 and 202 may be conducted through a number of processes known in the semiconductor art, such as, for example, an etching process. Once features 203 are formed, a conductive material 204, such as copper, for example, may be deposited into the respective features 203, as illustrated in step 220. More particularly, for example, a copper deposition process, such as physical vapor deposition, chemical vapor deposition, and/or electroplating may be used to form a copper layer over the entire surface of the substrate, including the features and the upper surface of amorphous carbon layer 202. Further, if desired, a barrier layer may be deposited prior to the fill copper layer 204, wherein the barrier layer is configured to prevent diffusion of the copper fill layer 204 into the surrounding layers. The copper fill layer 204 is generally formed using an over deposition process, i.e., copper is deposited in an amount sufficient to fill each of the features 203, which generally means that the copper is over deposited onto the upper surface of the dielectric layer 202. As such, various planarization techniques, such as chemical mechanical polishing and etch back techniques, for example, may be used to planarized the upper surface of dielectric layer 202, as well as the upper conductive surface of the features 203 having the conductive material 204 deposited therein. Regardless of the planarization technique employed, the end result is that the upper surface is planarized, as shown in step 220.

Once the upper surface is planarized, a mask layer 205 may be deposited over the dielectric layer and the conductive features 204 formed therein, as illustrated in step 230. The mask layer may be formed of a barrier layer material and/or other low k material, which are generally referred to as BLOk-type layers. The low k layer, along with any of the aforementioned low k layers may be formed via a deposition processing recipe that includes trimethylsilane (TMS) between about 300 sccm and about 2500 sccm, He up to about 5000 sccm, $NH_3$ up to about 1000 sccm, a pressure of between about 1 torr and about 14 torr, a power between about 50 watts and about 1500 watts, and a temperature of between about 300° C. and about 400° C. The mask layer may generally have a thickness of between about 100 angstroms and about 1000 angstroms, however, masks of greater or lesser thicknesses may also be implemented. Once mask layer 205 is formed, a plurality of mask holes or apertures 206 may be formed therein. The mask holes 206 may generally be positioned above the area separating the respective conductive members 204, i.e., holes 206 are generally positioned above the dielectric separation layer 202 and offset from a the conductive features 204. Once mask holes 206 are formed, the method continues to step 250, wherein the dielectric material separating the respective conductive members 204 is removed from the area between the respective conductive members 204. The apertures 204 may be circular holes or chimneys strategically placed over the dielectric layers, or alternatively, the apertures 204 may be elongated holes or channels that track over a portion of the dielectric to be stripped from thereunder. The removal process generally includes stripping out the dielectric material separating the respective conductive members 204 with a stripping process in order to yield an air gap or space 207 between the respective conductive members 204. Assuming that the dielectric material separating conductive members 204 is an amorphous carbon layer, a hydrogen based stripping process may be used to remove the amorphous carbon from the areas between the conductive members 204. As such, the stripping process generally includes the application of hydrogen to the amorphous carbon layer via mask holes 206, such that the amorphous carbon may be removed from the area between conductive members 204 by traveling out of the area of via mask hole 206. The result of the stripping process once the dielectric material/amorphous carbon is removed from the area between the conductive members 204 is that an air gap 207 is formed between the respective conductive members 204. Although a residue of the dielectric/amorphous carbon may remain in the air gap region, the space between conductive members 204 is generally an air space, and therefore, provides the dielectric constant of approximately 1. Further, in order to seal holes 206, a capping layer 208 may be deposited over the top of mask layer 205. The capping layer may be a porous oxide layer, a porous nitride layer, a porous BLOk layer, or other layer suitable for capping in a semiconductor device.

Figure 3:
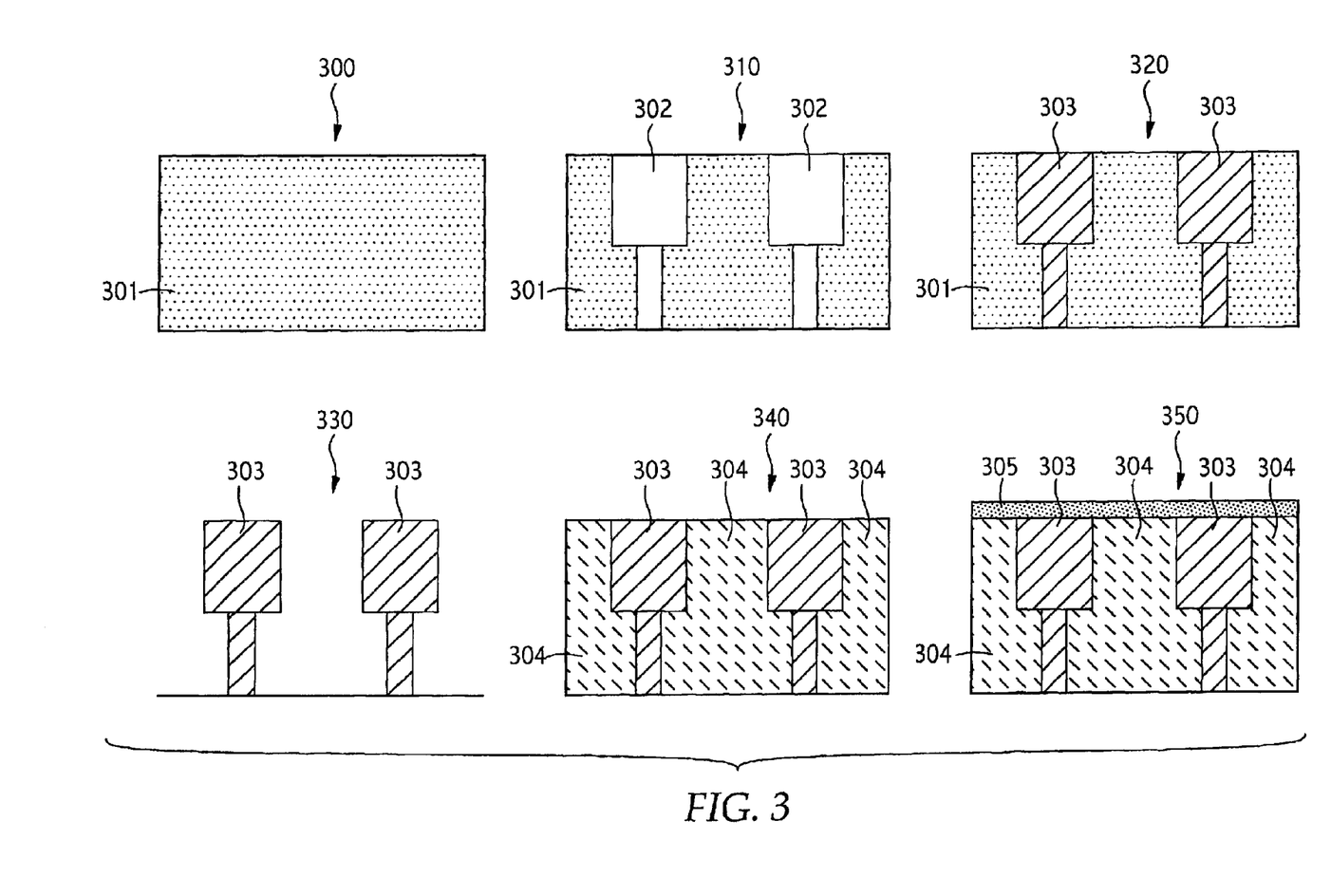
FIG. 3 illustrates an exemplary method for forming a low k air gap between conductive elements of a semiconductor device using an ELk layer.

In another embodiment of the invention, which is illustrated in FIG. 3, a damascene process may be used to generate a low k spacer between conductive members of a semiconductor device. The damascene process generally includes depositing an amorphous carbon layer 301 onto a substrate (not shown), as illustrated in step 300. The amorphous carbon layer 301 is generally of sufficient thickness to have semiconductor device features formed therein, and may be deposited through known semiconductor deposition techniques, such as, for example, chemical vapor deposition and plasma enhanced chemical vapor deposition. Once the amorphous carbon layer is formed, the method continues to step 310, where various interconnect features 302 are formed into the amorphous carbon layer 301. The various interconnect features 302, which may be trenches and/or vias, for example, may be formed into the amorphous carbon layer 301 via an etch process. Once features 302 are formed into the amorphous carbon layer 301, the features may be filled with a conductive material 303, which may be copper, for example. The copper fill material 303 may be deposited onto the amorphous carbon layer 301 and into the features 302 via known semiconductor deposition techniques, such as, for example, physical vapor deposition, chemical vapor deposition, electroless deposition, and/or electrochemical deposition processes, as illustrated in step 320. The process of depositing the conductive material into features 302 generally includes over depositing the conductive material and then removing the over deposition via a planarization or polishing process, as is known in the semiconductor art. Regardless of the fill and/or planarization processes employed, the end result is to fill features 302 with conductive material 303 and to generate a substantially planar upper surface above features 302 that is generally in the same plane as the upper surface of the remaining amorphous carbon layer 301.

Once features 302 are filled with the conductive material and planarized, the amorphous carbon layer positioned between the respective conductive elements 302 may be completely removed therefrom. The removal process may generally include a hydrogen based stripping process configured to completely remove the amorphous carbon layer, as illustrated in step 330. Once the interstitially positioned amorphous carbon is removed, the space previously occupied by the amorphous carbon may be filled with an extremely low k material 304. Although various extremely low k materials are contemplated within the scope of the present invention, generally, the dielectric constant of the material deposited between conductive elements 303 is in the range of about 1.7 to about 2.2, and preferably, about 2. In similar fashion to the metal deposition process illustrated in step 320, the deposition of the extremely low k material 304 also generally includes over deposition thereof in order to completely fill the space previously occupied by the amorphous carbon. As a result thereof, step 340 also generally includes a planarization step, such as a chemical mechanical polishing process, configured to planarize the upper surface of the conductive material 303 and the extremely low k material deposited between the material 303 elements. Once the planarization process is complete, the method continues to step 350, wherein a barrier layer 305 is deposited over the top of the conductive features 303 and the extremely low k layer 301. Barrier layer 305 generally operates to electrically isolate the conductive elements present in the layer formed beneath it from subsequent conductive elements deposited in a layer formed above barrier layer 305.

Figure 4:
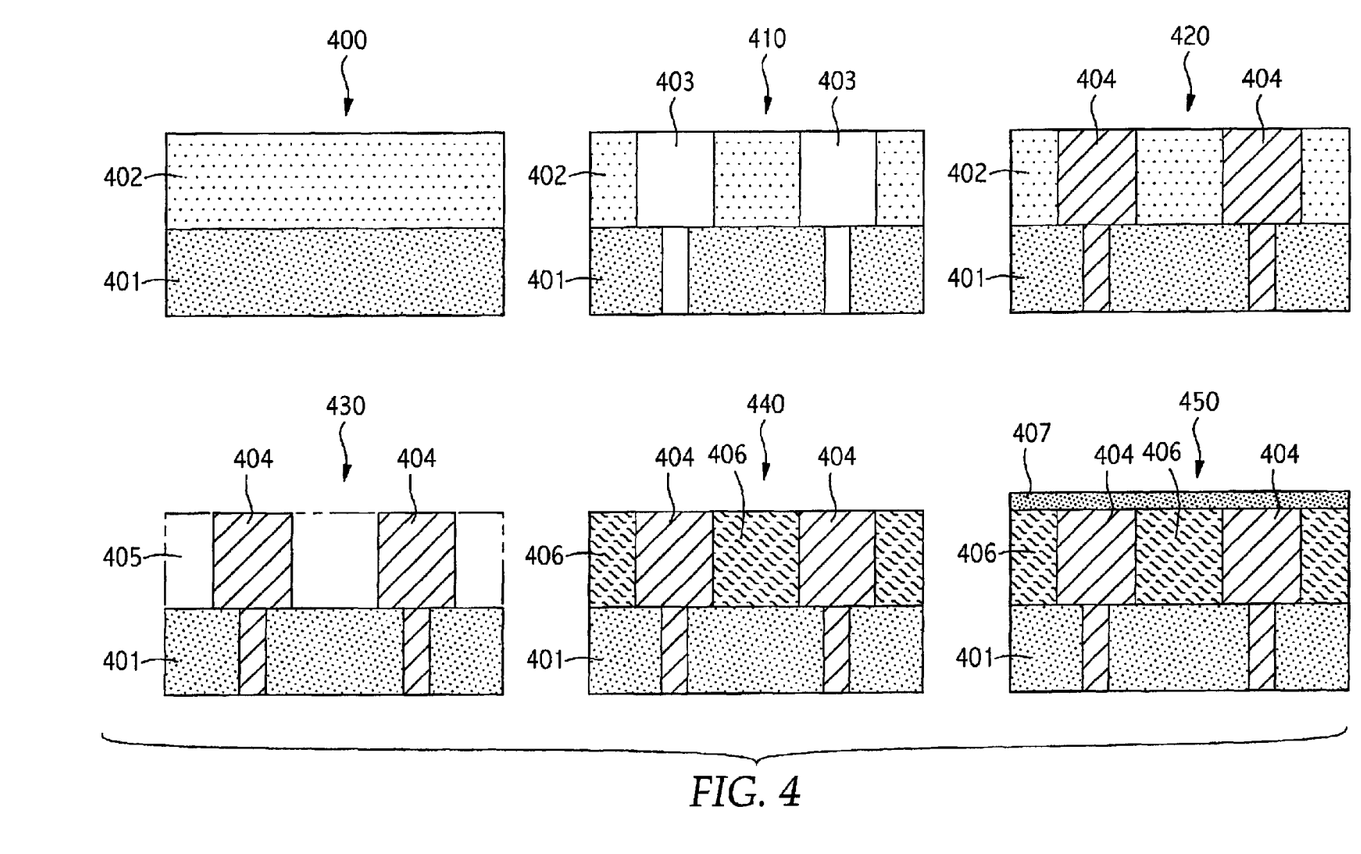
FIG. 4 illustrates an exemplary method for forming a low k air gap between conductive elements of a semiconductor device using an ELk layer and a Black Diamond™ insulating layer.

In yet another embodiment of the invention, a damascene method is provided for generating a low k spacer between conductive elements of a semiconductor device. As illustrated in FIG. 4, the method generally begins at step 400 with the deposition of the low k material 401 onto a substrate (not shown), it continues with the deposition of amorphous carbon layer 402 on top of layer 401. The low k material 401 may generally be a Black Diamond™ insulating layer. Once layers 401 and 402 are formed, the method continues to step 410, where various device features 403 may be formed into layers 401 and 402. The device features, which may be trenches, vias, or other features known to support semiconductor device formation, may be formed through an etch process, for example. Once the respective features 403 are formed, the method continues to step 420, where features 403 are filled with a conductive material 404. The conductive material, which may be copper, for example, may be filled into features 403 using known semiconductor layer formation techniques, such as, for example, physical vapor deposition, chemical vapor deposition, and/or electrochemical plating techniques. Regardless of the deposition techniques employed, the metal layer is generally over deposited into features 403, and therefore, is generally planarized subsequent to deposition.

Once the features are formed and are filled with a conductive material, the method generally continues to step 430, where in the amorphous carbon layer 402 may be removed from the areas between the conductive features 404. The removal of the amorphous carbon layer may generally be accomplished via a hydrogen stripping process, or other process generally known to be effective in removing amorphous carbon type layers. Once the amorphous carbon is removed, which essentially yields an airspace between the respective conductive members 404, the method continues to step 440, where the airspace is formed by the removal of the amorphous carbon material and filled with an extremely low k material 406. In similar fashion to the metal deposition process, the deposition of the extremely low k material is generally accomplished in an over-deposition process, and therefore, the over deposited material is generally removed from the surface of the device through, for example, a chemical mechanical polishing process. Therefore, when step 440 is completed, the device will generally include conductive members 404 having a material positioned therebetween that has an extremely low dielectric constant. Furthermore, the upper surface of the device, i.e., the upper surface of conductive members 404 into the upper surface of the material having the extremely low dielectric constant, is substantially planar is a result of the chemical mechanical planarization process. Thereafter, the method continues to step 450, wherein a barrier layer 407 is deposited over the conductive features 404 and the material having an extremely low dielectric constant 406.

In another embodiment of the invention, the amorphous carbon layer discussed in previous embodiments are replaced by a photoresist layer. In this embodiment, the photoresist may be deposited onto a substrate through known deposition techniques, such as, for example, a spin on deposition process. Once the photoresist is deposited onto the substrate, the photoresist layer may be patterned for conductive features, wherein the patterning process includes removing portions of the photoresist layer to form trenches, vias, etc. corresponding to the conductive features. The patterned features may then be filled with a conductive material, such as copper, for example, through, for example, an electroless deposition process, an electrochemical deposition process, or other copper deposition process suited to deposit copper onto a photoresist layer. Once the copper is deposited into the features, the surface, if required, may be planarized to generate a substantially planar upper surface with the photoresist and the conductive features formed therein. Then, in similar fashion to previous embodiments, a porous layer may be deposited thereover, the photoresist stripped out of the areas between the conductive features to generate an air gap, and a capping layer deposited over the porous layer to seal and prevent backflow into the air gap generated by the stripping process.

While the foregoing is directed to embodiments of the present invention, other and further embodiments of the invention may be devised without departing from the basic scope thereof, and the scope thereof is determined by the claims that follow.

What is claimed is:

1. A method for forming a low k spacer between conductive interconnects, comprising:

forming interconnect features into a dielectric layer deposited on a substrate, wherein the dielectric layer is an amorphous carbon layer;

filling the interconnect features with a conductive material;

depositing a porous layer over the filled interconnect features and dielectric layer, the porous layer having an ordered pore structure;

removing at least a portion of the dielectric layer out of an area between the filled conductive interconnects through the porous layer to form an air gap between the conductive interconnects, wherein the removing comprises a downstream hydrogen based stripping process; and depositing a capping layer over the porous layer to seal the ordered pore structure.

2. The method of claim 1, wherein depositing the porous layer comprises:

depositing a liquid solution over the substrate, the liquid solution reacting to form partially polymerized silanols suspended in the solution; and curing the soltition on the substrate to form the porous layer.

3. The method of claim 2, wherein the liquid solution comprises a hydrolyzed silicon alkoxide, a water-soluble solvent, and an acid.

4. The method of claim 3, wherein the silicon alkoxide comprises tetraethylorthosilicate and the water-soluble solvent comprises propylene glycol monopropyl ether.

5. The method of claim 1, wherein the air gap provides a dielectric constant of about 1.

6. The method of claim 1, wherein the filling the interconnect features comprises at least one of a physical vapor deposition process, a chemical vapor deposition process, an electrochemical plating process, and an electroless plating process.

7. The method of claim 1, wherein the porous layer comprises a porous oxide layer.

8. The method of claim 1, further comprising planarizing an upper surface of the substrate between the filling the interconnect features and the depositing a porous layer, wherein the planarizing comprises using chemical mechanical polishing.

9. A method for forming a spacer between conductive members of a semiconductor device, comprising:

depositing a dielectric layer on a substrate, wherein the dielectric layer is an amorphous carbon layer;

forming features into the dielectric layer;

filling the features with a conductive material to form the conductive members;

depositing a porous layer over the conductive members and dielectric layer, the porous layer having an ordered pore structure;

stripping the dielectric layer out of an area between the conductive members through the porous layer to form an air gap between the conductive members, wherein the stripping comprises using a downstream hydrogen-based stripping process to remove the dielectric layer from the area between the conductive members by stripping the dielectric layer out through the porous layer; and depositing a capping layer over the porous layer to seal the ordered pore structure.

10. The method of claim 9, wherein the porous layer is a porous oxide layer.

11. The method of claim 9, wherein the stripping the dielectric layer further comprises stripping the dielectric layer out of an area between the conductive members through an aperture formed in the porous layer.

12. The method of claim 9, wherein depositing the porous layer comprises:

flowing a liquid solution over the substrate, the liquid solution reacting to form partially polymerized silanols suspended in the solution; and drying the solution on the substrate to form the porous layer.

13. The method of claim 12, wherein the liquid solution comprises a hydrolyzed silicon alkoxide, a water-soluble solvent, and an acid.

14. The method of claim 13, wherein the silicon alkoxide comprises tetraethylorthosilicate and the water-soluble solvent comprises propylene glyool monopropyl ether.

15. The method of claim 9, wherein the air gap provides a dielectric constant of about 1.

16. The method of claim 9, wherein the filling the features comprises at least one of a physical vapor deposition process, a chemical vapor deposition process, an electrochemical plating process, and an electroless plating process.

17. The method of claim 9, further comprising planarizing an upper surface of the semiconductor device between the filling the features and the depositing a porous layer.

18. A method for forming a spacer having a dielectric constant of about 1 between conductive features of a semiconductor device, comprising:

depositing an amorphous carbon layer onto a substrate using a chemical vapor deposition process;

etching features into the amorphous carbon layer;

filling the features etched into the amorphous carbon layer with a conductive material to form the conductive feature using at least one of an electrochemical plating process, an electroless plating process, a physical vapor deposition process, and a chemical vapor deposition process;

using a chemical mechanical polishing process to planarize an upper surface of the semiconductor device;

depositing a porous oxide layer over the conductive features and amorphous carbon layer;

stripping the amorphous carbon layer from areas between the conductive features via a downstream hydrogen-based stripping process configured to remove the amorphous carbon layer through pores in the porous oxide layer, which operates to form an air gap between the conductive features; and depositing a capping layer over the porous oxide layer to seal the pores.

* * * * *

UNITED STATES PATENT AND TRADEMARK OFFICE
CERTIFICATE OF CORRECTION

PATENT NO. : 6,780,753 B2
APPLICATION NO. : 10/159711
DATED : August 24, 2004
INVENTOR(S) : Latchford et al.

Page 1 of 1

It is certified that error appears in the above-identified patent and that said Letters Patent is hereby corrected as shown below:

In the Claims:

Column 11, Claim 14, Line 25, please delete "glyool" and insert --glycol-- therefor;

Column 12, Claim 18, Line 13, please delete "feature" and insert --features-- therefor.

Signed and Sealed this
Twenty-sixth Day of February, 2013

Teresa Stanek Rea
*Acting Director of the United States Patent and Trademark Office*